(12) United States Patent
Basol

(10) Patent No.: US 7,795,067 B1
(45) Date of Patent: Sep. 14, 2010

(54) SEMITRANSPARENT FLEXIBLE THIN FILM SOLAR CELLS AND MODULES

(75) Inventor: Bulent M. Basol, Manhattan Beach, CA (US)

(73) Assignee: Solopower, Inc., San Jose, CA (US)

( * ) Notice: Subject to any disclaimer, the term of this patent is extended or adjusted under 35 U.S.C. 154(b) by 0 days.

(21) Appl. No.: 12/414,422

(22) Filed: Mar. 30, 2009

(51) Int. Cl.
*H01L 21/00* (2006.01)

(52) U.S. Cl. .............. 438/84; 438/57; 438/85; 257/E31.001; 257/E27.123

(58) Field of Classification Search .......... 438/57, 438/84, 85; 257/E31.001, E27.123
See application file for complete search history.

(56) References Cited

U.S. PATENT DOCUMENTS 6,566,162 B2 * 5/2003 Yamada et al. ............... 438/95
7,632,701 B2 * 12/2009 Dhere et al. ................. 438/84

OTHER PUBLICATIONS

Boueke, A., et al., "Latest Results on Semitransparent POWER Silicon Solar Cells", *Solar Energy Mats. & Solar Cells*, vol. 65, (2000), pp. 549-553.
Jooss, W., et al., "Recent Results on Semi-Transparent Power Cells", *3rd World Conf. on PV Energy Conf.*, May 11-18, 2003, Proceedings CD, pp. 1439-1442.

* cited by examiner

*Primary Examiner*—Alexander G Ghyka
*Assistant Examiner*—Seahvosh J Nikmanesh
(74) *Attorney, Agent, or Firm*—Pillsbury Winthrop Shaw Pittman LLP

(57) ABSTRACT

A method of manufacturing partially light transparent thin film solar cells generally includes forming a solar cell structure stack and forming multiple openings through the solar cell structure stack. The solar cell structure stack includes a flexible foil substrate, a contact layer formed over the flexible foil substrate, a Group IBIIIAVIA absorber layer formed over the contact layer and a transparent conductive layer formed over the Group IBIIIAVIA absorber layer. A terminal structure including at least one busbar and a plurality of conductive finger patterns is deposited onto a top surface of the transparent conductive layer forming a semi-transparent solar cell.

18 Claims, 3 Drawing Sheets

SEMITRANSPARENT FLEXIBLE THIN FILM SOLAR CELLS AND MODULES

FIELD OF THE INVENTION

The present invention relates to fabrication of semitransparent flexible thin film solar cells and modules.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In, Ga, Al)(S, Se, Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In, Ga, Al)(S, Se, Te)_2$, is grown over a conductive layer 13 or contact layer, which is previously deposited on the substrate 11 and which acts as the electrical contact to the device. The substrate 11 and the contact layer 13 form a base 20. Various conductive layers comprising Mo, Ta, W, Ti, and stainless steel etc. have been used in the solar cell structure of FIG. 1. If the substrate itself is a properly selected conductive material, it is possible not to use a contact layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In, Ga, Al)(S, Se, Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In, Ga)(S,Se)_2$ or CIGS(S) means the whole family of compounds with the Ga/(Ga+In) molar ratio varying from 0 to 1, and the Se/(Se+S) molar ratio varying from 0 to 1.

$Cu(In,Ga)(S,Se)_2$ type compound thin films may be deposited over the selected substrate by various methods such as co-evaporation, sputtering/co-sputtering, ink deposition, electrodeposition, etc., One technique for growing $Cu(In,Ga)(S,Se)_2$ type compound thin films for solar cell applications is a two-stage process where metallic components of the $Cu(In, Ga)(S,Se)_2$ material are first deposited onto a substrate, and then reacted with S and/or Se in a high temperature annealing process. For example, for CIS or $CuInSe_2$ growth, thin layers of Cu and In are first deposited on a substrate and then this stacked precursor layer is reacted with Se at elevated temperature. If the reaction atmosphere also contains sulfur, then a CIS(S) or $CuIn(S,Se)_2$ layer can be grown. Addition of Ga in the precursor layer, i.e. use of a Cu/In/Ga stacked film precursor, allows the growth of a CIGS(S) or $Cu(In,Ga)(S,Se)_2$ absorber. The precursor layers may be deposited by various methods such as evaporation, sputtering, ink deposition, electrodeposition, etc.

Two-stage process approach may also employ stacked layers comprising Group VIA materials. For example, a CIGS or $Cu(In,Ga)Se_2$ film may be obtained by depositing In—Ga—Se and Cu—Se layers in an In—Ga—Se/Cu—Se stack and reacting them in presence of Se. Similarly, stacks comprising Group VIA materials and metallic components may also be used. Stacks comprising Group VIA materials include, but are not limited to In—Ga—Se/Cu stack, Cu/In/Ga/Se stack, Cu/Se/In/Ga/Se stack, etc. The stacks may be deposited over the substrate using the various methods listed above.

Building Integrated Photovoltaics (BIPV) used in buildings often needs semitransparent solar cells and modules that can be utilized on building facades. These devices, while generating electricity, also let some predetermined amount of the light impinging on the solar module into the building. The semitransparent PV modules may have a transparency in the 10-70% range.

One way of achieving semi-transparency in PV modules is to use a transparent front protective sheet and back protective sheet in the module structure and leave large gaps between the solar cells in the module. The larger the gaps are between the solar cells, the more sun light passes from the front side of the module to the back side. However, this method is not attractive because as the space between cells increases the interconnection wiring or the interconnection ribbons that electrically connect each solar cell with its neighboring cell becomes more and more visible.

Modules made of amorphous silicon can also be made partially transparent by employing thin absorber layers and transparent contacts. In such amorphous silicon applications, the transparency of the solar cell itself can be controlled by the thickness and type of the amorphous silicon. This method cannot be used for CIGS and CdTe type solar cells because these solar cells employ metallic contact layers that are opaque.

One other method used to achieve semi-transparency for crystalline silicon solar cells involves mechanical texturization of the front and rear side of the silicon wafer before the cell is fabricated. In this method, perpendicular grooves made on the front and rear sides of the silicon wafer create holes at their crossing points if the depth of each groove is larger than half of the thickness of the Si wafer. The size of the holes can be controlled by controlling the depth of the grooves, deeper grooves creating larger holes. The holes in silicon solar cells result in a partial optical transparency of the device. A hole size obtained with such methods is typically in the range of 100-200 µm diameter. These devices are extremely fragile because the grooves penetrate into the silicon along substantially the whole length of the solar cell and reduce the mechanical strength of the substrate, which typically have a total thickness in the 200-400 µm range. Therefore, in order to optimize the mechanical strength of the device, the hole size is limited so that the transparency of the device is typically in the range of 15-25% range. The grooves opened in the Si substrate also make solar cell processing difficult. Thin film solar cells have absorber layer thicknesses in the 1-10 µm range. Therefore, the grooving method cannot be used in such devices. Grooves with depths of 0.5-8 microns would yield holes with diameters in the range of only a few microns. Furthermore, fragile nature of thin films would not allow defect free grooving with the required precision.

Therefore there is a need for robust, semi-transparent thin film flexible solar cells that can be handled without concern for breakage.

SUMMARY

The present invention provides a method to form partially light transparent solar cells with continuous flexible substrates. Accordingly a method of manufacturing partially light transparent or semitransparent thin film solar cells generally includes forming a solar cell structure stack and forming multiple openings through the solar cell structure stack for a predetermined amount of light to go through. In one embodiment the solar cell structure stack includes a flexible foil substrate, a contact layer formed over the flexible foil substrate, a Group IBIIIAVIA compound absorber layer formed over the contact layer and a transparent conductive layer formed over the Group IBIIIAVIA absorber layer.

Each of the openings extends through the transparent conductive layer, the Group IBIIIAIVA absorber layer, the contact layer and the flexible foil substrate; thereby making the solar cell structure stack partially light transparent. A terminal structure including at least one busbar and a plurality of conductive finger patterns is deposited onto a top surface of the transparent conductive layer forming a semi-transparent solar cell. Alternatively, the step of forming the one or more openings can be performed after the terminal, including the at least one busbar and the plurality of conductive finger patterns, is deposited onto the top surface of the transparent conductive layer.

DETAILED DESCRIPTION

The present inventions provide a partially light transparent solar energy conversion device such as a solar cell or solar cell module, and a variety of processes to manufacture the partially light transparent solar energy device with adjustable light transparency. The solar cells of the present inventions are fabricated on flexible foil substrates, such as flexible polymeric or metallic substrates. In one embodiment, the manufacturing process includes forming a solar cell structure stack by depositing a contact layer on a flexible foil substrate, forming an absorber layer on the contact layer, and forming a transparent conductive layer on the absorber layer. After forming the solar cell structure stack, through-holes or apertures, which permit light to pass through the stack, are formed in the solar cell in a determined pattern or arrangement. Each hole extends from a top opening in a front surface of the solar cell structure stack to a bottom opening in a bottom surface of the substrate. The top openings of the holes are distributed within an active region of the front surface. Further, a passive region of the front surface is designated for a finger pattern of the solar cell. After the holes formed, the finger pattern is deposited on the passive region of the front surface of the solar cell structure stack. In another embodiment, the holes are formed within the active region after depositing the finger patterns on the passive region of the front surface of the solar cell structure stack. Light transparency of the solar cell is provided by holes formed through the thickness of the device after the solar cell is fabricated. The ratio of the area of the active region occupied by the holes to the total area of the solar cell gives the transparency rate of the solar cell.

Figure 1:
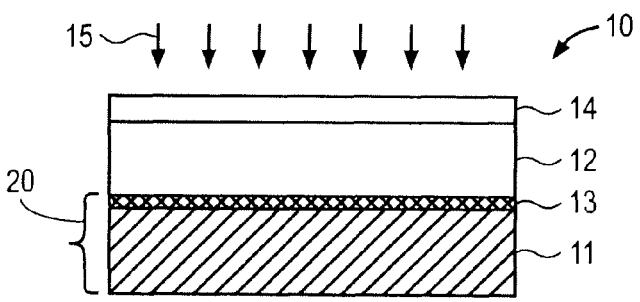
FIG. 1 is a cross-sectional view of a solar cell employing a Group IBIIIAVIA absorber layer.
Figure 2A:
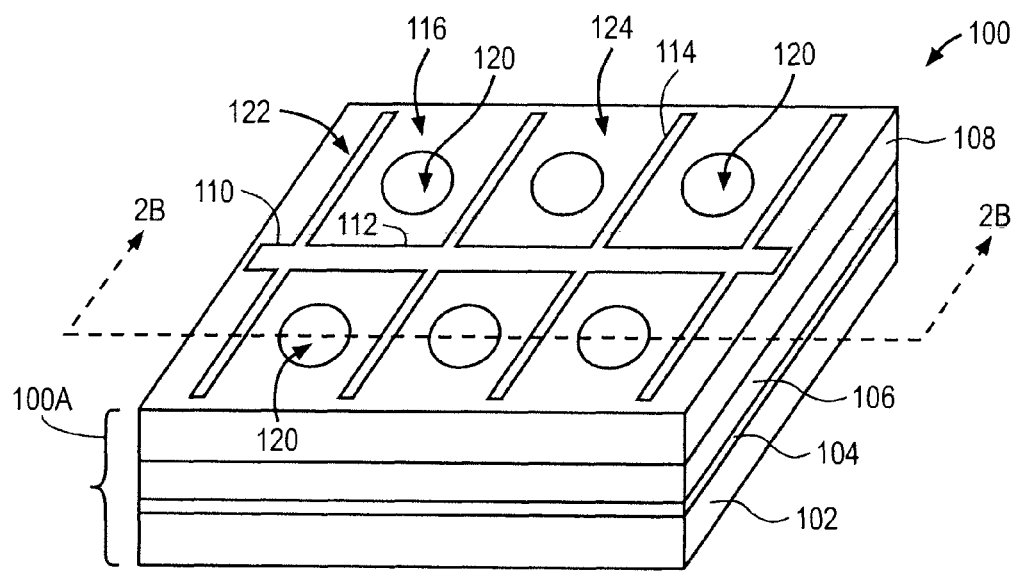
FIGS. 2A-2B are schematic perspective and cross sectional views of a semitransparent solar cell of the present invention.
Figure 2B:
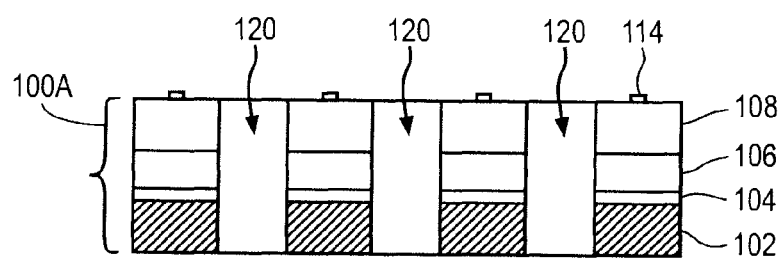

FIG. 2A shows in perspective view a solar cell 100 including a flexible foil substrate 102, a contact layer 104 formed over the flexible foil substrate, an absorber layer 106 such as a Group IBIIIAVIA absorber layer formed over the contact layer 104 and a transparent conductive layer 108 formed over the Group IBIIIAVIA absorber layer. The flexible foil substrate 102, the contact layer 104, the absorber layer 106 and the transparent conductive layer 108 form a solar cell structure stack 100A. A terminal structure 110 or current collecting electrode including a busbar 112 and fingers 114 is deposited onto a top surface 116 of the transparent conductive layer, which is also the light receiving surface of the solar cell 100. Holes 120 or openings are formed through the solar cell structure stack 100A using a mechanical mechanism, such as by die cutting, punching, drilling, or the like. In a preferred embodiment, the mechanical mechanism will create all of the holes that are desired for the entire solar cell/solar cell structure stack at the same time, in a predetermined pattern, by having a plurality of punches or the like corresponding to each hole that is made. FIG. 2B is a cross sectional view of FIG. 2A taken along the line 2B-2B. As shown in FIG. 2B, the holes 120 are formed and extend through the substrate 102, the contact layer 104, the absorber layer 106 and the transparent conductive layer 108. Holes 120 make the solar cell 100 semi-transparent to light. Holes 120 may be formed after depositing the terminal structure 110 over the surface of the transparent conductive layer 108, i.e. after completion of the solar cells, or can be formed prior to depositing the terminal structure 110 over the surface of the transparent conductive layer 108.

The terminal structure 110 is formed over a passive region 122 of the top surface 116 whereas the holes 120 are formed in an active region 124 of the surface 116. It should be noted that the passive region 122 shown in FIG. 2A refers to the region right under the terminal structure 110. Each hole 120 formed within the active area of a solar cell with a total area of "A" reduces the area of the available active region 124 while increasing the transparency of the solar cell 100. Therefore, the ratio between the area occupied by the total number of holes (e.g., B) to the total area of the solar cell gives the transparency of the solar cell structure stack or the solar cell. For example, by adjusting the B/A ratio a transparency range of the solar cell structure stack may be adjusted in a range of 10-50% or higher.

Figure 3A:
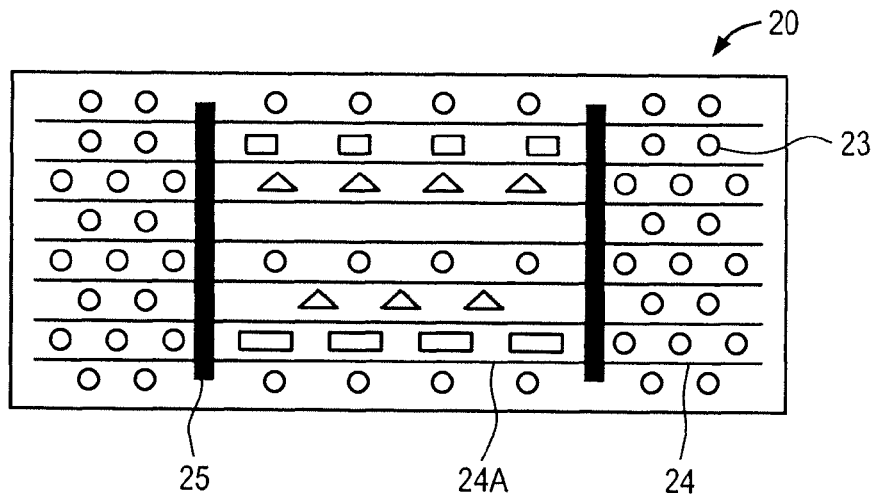
FIGS. 3A-3C are schematic views of various exemplary semi-transparent thin film solar cells with holes.
Figure 3B:
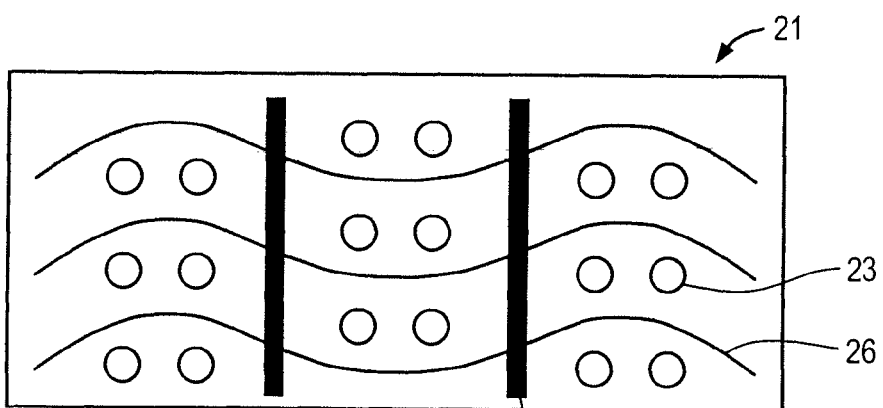
Figure 3C:
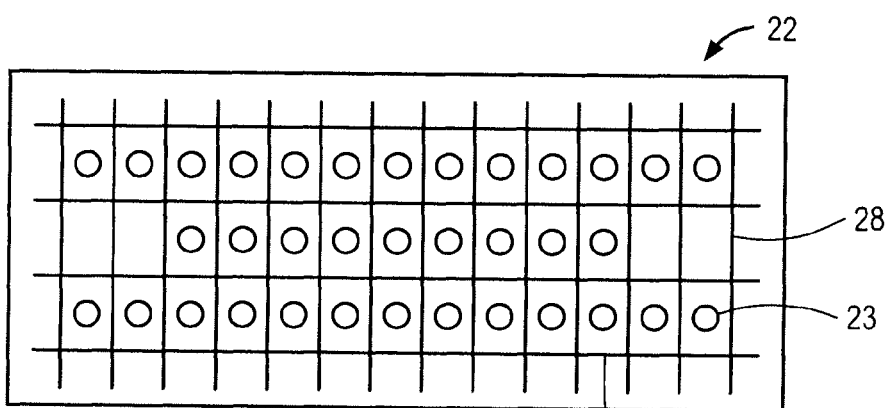

FIGS. 3A, 3B and 3C are top views (illuminated surface views) of exemplary devices. In FIG. 3A, a solar cell 20 has holes 23 and a terminal structure 24 or current collecting electrode. The terminal structure 24 is formed of fingers 24A and busbars 25. The holes 23 are formed in areas avoiding damage to the terminal structure 24. As is shown in FIG. 3A, the holes 23 in the solar cell may have different shapes and sizes, as well as patterns. Therefore, many different appearances may be achieved using different hole geometries and patterns and terminal structure designs. The appearance can be one in which a substantially uniform transparency results across the entire solar cell 20, and can also be one in which a predetermined illumination gradient, which corresponds to an overall transparency pattern that results from the hole geometries and patterns and terminal design. Different ways can be used to achieve the same results in terms of appearance. FIG. 3B shows a solar cell with wavy finger pattern 26 and large holes 23. FIG. 3C shows another device 22 with a mesh 28 as the current collecting grid and smaller holes 23 in between the mesh conductor. In both the FIG. 3B and the FIG. 3C embodiments, the resulting appearance is one in which there is substantially uniform transparency, as the holes are located in a substantially uniform pattern across the entire solar cell. It is noted that although holes 23 do not exist in four different grid locations formed by the terminal structure design mesh 28, the absence of these few holes will not result in an appreciable difference in the appearance of the transparency. If the hole pattern of a semitransparent solar cell is such that the hole size and distribution over the solar cell is substantially uniform, such cells may be used in module structures that yield an overall transparency that is also substantially uniform. It is however, also possible to mix solar cells with substantially uniform hole patterns and substantially non-uniform hole patterns or even totally opaque (hole-free) solar cells in a module structure to create the desired visual effect. For example, the logo of a company may be written on a module or an array of modules by designing holes that form the logo on otherwise hole-free solar cells or modules. As can be seen from the discussion above, solar cells with different degrees of transparency and different visual effects can be easily fabricated using hole designs that fit the need for the BIPV application. Solar cell modules having a perceived uniform transparency can be made by stringing together solar cells that each have a substantially uniform transparency. It is also possible to create an overall transparency pattern by stringing together solar cells that have perceived uniform transparency and solar cells that have either no transparency or a perceived non-uniform transparency.

As discussed previously, in prior art silicon devices with holes, the silicon substrate is first grooved forming the holes. The solar cell is then fabricated on the Si substrate with the holes. Thin film solar cell devices of the present invention are fabricated in other ways, described hereinafter, due to the differences between the types of devices. It should be noted that grooving methods are not practical for thin film solar cell structures, especially for flexible thin film solar cell structures.

In one embodiment, a complete solar cell is fabricated on the foil substrate, the solar cell comprising a base, an absorber layer, a transparent layer through which light enters the device, and a grid pattern to collect the generated current. Holes are then punched through the solar cell, avoiding damage to the grid pattern. Alternately, holes may be first opened in the solar cell structure stack without a current collecting grid in a predetermined fashion and the grid pattern may then be deposited on the cell on a predetermined location in a way that avoids deposition of the grid onto areas with holes.

For thin film solar cells employing a CIGS(S) type absorber layer, holes providing certain degree of transparency to the device may be formed during the various process steps used for the fabrication of the device. For example, the typical process flow for CIGS solar cell fabrication comprises the steps of; i) providing a flexible foil substrate, ii) depositing a contact layer on a surface of the substrate, iii) forming a CIGS(S) absorber layer on the contact layer, iv) depositing a transparent conductive layer (such as a CdS/TCO stack) on the absorber layer, and v) depositing a grid pattern on the transparent layer. Holes may be formed in the structure after any of the steps (i), (ii), (iii), (iv), and (v) listed above and the rest of the process steps may be completed after the formation of the holes. Holes may also be formed in a roll to roll fashion in technologies that process CIGS solar cells in a roll-to-roll fashion.

Figure 4:
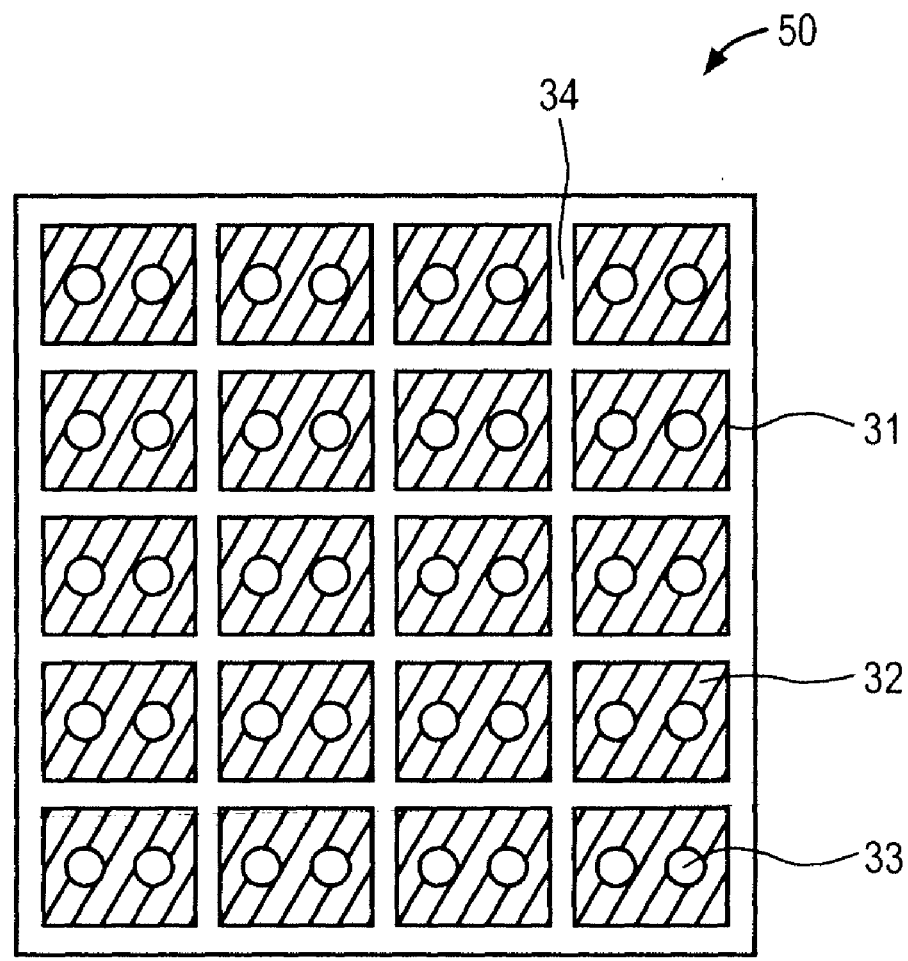
FIG. 4 is a schematic view of a module employing semi-transparent thin film solar cells with holes.

Thin film flexible solar cells such as CIGS(S) based solar cells with hole patterns may be packaged in rigid or flexible module structures to yield semi-transparent rigid or flexible modules if a transparent back protective sheet such as a transparent polymeric foil, preferably with a moisture barrier coating is employed in the structure. One such exemplary module is shown in FIG. 4, the module 30 comprising twenty interconnected solar cells 31. The interconnections and the grid patterns of the solar cells are not shown in this figure for simplification. The solar cells 31 comprise an active region 32 that is shown as shaded regions, and holes 33 that give the module 30 transparency, along with the gaps 34 between the solar cells 31. By adjusting the sizes of the gaps 34 and the holes 33, the transparency of the module 30 may be adjusted. A preferred range of the size of the holes 33 is 0.1-2 cm. A more preferred range is 0.2-1 cm.

Although the present invention is described with respect to certain preferred embodiments, modifications thereto will be apparent to those skilled in the art.

I claim:
1. A method of manufacturing a semitransparent thin film solar cell structure stack, comprising:
   forming a solar cell structure stack wherein the solar cell structure stack includes a flexible foil substrate, a contact layer formed over the flexible foil substrate, a Group IBIIIAVIA absorber layer formed over the contact layer and a transparent conductive layer formed over the Group IBIIIAVIA absorber layer; and
   mechanically forming a plurality of openings through the solar cell structure stack to create a hole pattern in the solar cell structure stack, each of the openings in the hole pattern extending through the transparent conductive layer, the Group IBIIIAIVA absorber layer, the contact layer and the flexible foil substrate, thereby making the semitransparent solar cell structure stack.

2. The method of claim 1 further comprising forming a terminal including a busbar and fingers on a top surface of the transparent conductive layer, thereby forming a semitransparent thin film solar cell.

3. The method of claim 2, wherein the top surface of the transparent conductive layer includes a passive region on which the terminal is formed and an active region on which the plurality of openings are located.

4. The method of claim 3, wherein a transparency range of the semitransparent thin film solar cell is 10-50%.

5. The method of claim 2 further comprising the step of stringing together a plurality of semitransparent thin film solar cells, thereby creating a semitransparent thin film solar cell module.

6. The method of claim 5, wherein the step of stringing further includes a plurality of non-transparent thin film solar cells.

7. The method of claim 5, wherein the semitransparent thin film solar cells and the non-transparent thin film solar cells are arranged in a pattern to provide an overall transparency pattern.

8. The method of claim 2, wherein a diameter of the plurality of openings is in the range of 0.1-2 cm.

9. The method of claim 1 further comprising forming a terminal including a busbar and fingers on a top surface of the transparent conductive layer, thereby forming a thin film solar cell prior to the step of mechanically forming the plurality of openings and thereby resulting in a semitransparent solar cell.

10. The method of claim 9, wherein the top surface of the transparent conductive layer includes a passive region on which the terminal is formed and an active region on which the plurality of openings are located.

11. The method of claim 10, wherein a transparency range of the semitransparent thin film solar cell is 10-50%.

12. The method of claim 9 further comprising the step of stringing together a plurality of semitransparent thin film solar cells, thereby creating a semitransparent thin film solar cell module.

13. The method of claim 12 wherein the step of stringing further includes a plurality of non-transparent thin film solar cells.

14. The method of claim 12 wherein the semitransparent thin film solar cells and the non-transparent thin film solar cells are arranged in a pattern to provide an overall transparency pattern.

15. The method of claim 1, wherein the step of mechanically forming is performed using at least one of die cutting, punching and drilling.

16. The method of claim 1, wherein the step of mechanically forming mechanically forms all of the plurality of openings for the hole pattern at the same time.

17. The method of claim 1, wherein the hole pattern creates a substantially uniform overall transparency across the solar cell structure stack.

18. The method of claim 1, wherein the hole pattern creates a non-uniform overall transparency across the solar cell structure stack.

* * * * *